United States Patent [19]
Holzl et al.

[11] Patent Number: 5,304,397
[45] Date of Patent: Apr. 19, 1994

[54] OXIDATION RESISTANT CARBON AND METHOD FOR MAKING SAME

[75] Inventors: Robert A. Holzl, LaCanada, Calif.; Benjamin H. Tilley, Eugene, Oreg.; Robert E. Benander, Sylmar, Calif.; Vincent L. Magnotta, Coopersburg, Pa.; Paul N. Dyer, Allentown, Pa.

[73] Assignee: Air Products and Chemicals, Inc., Allentown, Pa.

[21] Appl. No.: 131,480

[22] Filed: Dec. 3, 1987

Related U.S. Application Data

[60] Division of Ser. No. 873,004, Jun. 11, 1986, which is a continuation-in-part of Ser. No. 654,329, Sep. 24, 1984, abandoned.

[51] Int. Cl.$^5$ ............................................. C23C 16/30
[52] U.S. Cl. .................................... 427/249; 427/279
[58] Field of Search ............................. 427/249, 279

[56] References Cited

U.S. PATENT DOCUMENTS 3,131,089  4/1964  Grulke et al.
3,306,764  2/1967  Lewis et al.
3,978,253  8/1976  Sahm.
4,515,860  5/1985  Holzl et al.

Primary Examiner—Donald P. Walsh
Assistant Examiner—Chrisman D. Carroll
Attorney, Agent, or Firm—Keith D. Gourley; James C. Simmons; William F. Marsh

[57] ABSTRACT

A coated carbon body having improved resistance to high temperature oxidation and a method for producing the coated carbon body are described. The coated carbon body comprises a carbon body, an intermediate glass forming coating within said converted layer, and an outer refractory coating on the intermediate coating. The body has a converted porous layer formed by etching and reacting the body with gaseous boron oxide and the resulting converted layer contains interconnecting interstices and boron carbide formed by the reaction of the boron oxide and the carbon body. The method comprises contacting a carbon body with boron oxide at an elevated temperature sufficient to cause the reaction between the carbon body and boron oxide to form a converted porous layer which contains interconnecting interstices in the body and boron carbide and then applying the intermediate glass forming coating over the converted layer and an outer refractory coating over the intermediate coating.

13 Claims, 1 Drawing Sheet

BORON OXIDE ETCHED ZONE OF CARBON/CARBON COMPOSITE - CROSS SECTIONAL SEM (320 X)

BORON OXIDE ETCHED ZONE OF CARBON/CARBON COMPOSITE - CROSS SECTIONAL SEM (320 X)

OXIDATION RESISTANT CARBON AND METHOD FOR MAKING SAME

This application is a division of application Ser. No. 873,004, filed Jun. 11, 1986, which is in turn a continuation-in-part of Ser. No. 654,329, filed Sep. 24, 1984, now abandoned.

TECHNICAL FIELD

This invention relates generally to carbon bodies having improved resistance to oxidation, and more particularly to a method for the manufacture of carbon bodies having improved oxidation-resistance at both high and intermediate temperatures and to oxidation-resistant carbon bodies produced thereby.

The desirability of providing carbon bodies having oxidation resistance is well-known. Carbonaceous materials such as monolithic carbon, graphite, and carbon-carbon composites of fibers in carbon have excellent strength-to-weight properties at high temperatures, e.g., 1400° C. and higher, and are generally superior to conventional construction materials such as metals and superalloys at these temperatures. In addition, the mechanical strength of a carbon body increases as the temperature increases, whereas in conventional structural metals, the strength decreases with increased temperature.

The use of carbon bodies in high temperature applications has been limited due to the relatively high reactivity of carbon, principally with oxygen, at temperature above about 400°-500° C. which results in erosion of the carbon body due to the reaction between carbon and oxygen, yielding carbon monoxide and carbon dioxide. Accordingly, many attempts have been made to provide oxidation-resistant coatings for carbon bodies in order to permit their use in oxidizing environments and at elevated temperatures.

Major difficulties have been encountered in attempting to provide oxidation-resistant coatings on carbon bodies. One difficulty is the wide variation in the coefficient of expansion of various types of carbon bodies and differences in the coefficient of expansion between the carbon body and the coating material. Depending on the raw materials, the coefficient of expansion of the carbon body may be vastly different from that of the oxidation-resistant coating. The stresses that result from different coefficients of expansion between the coating and the underlying carbon body cause cracking or rupture of the coating, particularly when the part is subjected to thermal cycling, which allows oxygen to penetrate the coating and attach the underlying carbon body with resulting loss of structural integrity.

Surface porosity in the carbon body, which results from articles which are not fully densified, may cause pinholes to form in the coating during the coating process which also may result in the ability of oxygen to penetrate to the carbon surface. It has also been found that mechanical vibration, debris impingement, and the like may cause cracking of brittle protective coatings.

Successful resistance to high temperature oxidation may be achieved by the process disclosed in U.S. Pat. No. 4,515,860 which is incorporated herein by reference. The oxidation-resistant carbon body disclosed in this patent has thermochemically deposited thereon a silicon alloy coating containing one or more alloying elements selected from the group consisting of carbon, oxygen, aluminum, and nitrogen. The amount of silicon in the coating is in excess of the stoichiometric amount and the alloy coating has a noncolumnar grain distribution having substantially equiaxial grains of an average diameter of less than 1 micron. Because of the exceptionally fine grain size and even grain distribution in the coating, any cracks that may occur are extremely fine in width and form a mosaic pattern. The amount of silicon in excess of the stoichiometric amount fills in these fine cracks when the carbon body is heated to above the melting point of silicon, e.g., above 1410° C., and reacts with any oxygen to form a glassy silicon oxide which acts as a filler sealing the cracks. This patent also contemplates, on an optional basis, particularly where lower temperature crack-resistance is desired, providing an intermediate boron layer. Boron reacts with oxygen to form a glassy boron oxide sealant and flows into any cracks that have formed. In commercial practice the carbon body is usually provided with a preliminary treatment in a mixture of chromic acid and sulfuric acid.

The oxidation resistance conferred by the coatings described in U.S. Pat. No. 4,515,860 provides significant superior characteristics as compared to the coatings of the prior art. Under some circumstances, however, particularly where severe temperature cycling occurs, the protection system may be inadequate to properly seal the cracking which occurs in the brittle coating such that the carbon body is subjected to oxidative attack.

SUMMARY OF THE INVENTION

The present invention provides a coated carbon body having improved resistance to oxidation over wide temperature ranges including low temperatures of 500°-1000° C. and high temperatures in excess of 1400° C. In addition, this invention provides a method for the manufacture of carbon bodies having improved resistance to oxidation over wide temperature ranges and in environments that involve high temperature thermal cycling.

Still further, the present invention provides ablation and erosion resistance to carbon bodies in high temperature oxidizing and non-oxidizing atmospheres.

Very generally, in accordance with the method of the present invention, a carbon body is heated to an elevated temperature, generally above about 1500° C., sufficient to cause a reaction between the carbon body and a gaseous boron oxide reactant. This reaction causes the surface of the carbon body to become etched and results in the formation of boron carbide which is contained in the converted and etched surface. The resulting etched and converted surface zone is about 2 to 250 microns deep. The converted carbon body is thereafter provided with an intermediate glass forming coating. The carbon body is thereafter provided with an outer silicon carbide coating which may contain silicon in excess of stoichiometry.

The coated carbon body in accordance with the present invention has an outer refractory coating and an intermediate glass forming coating which reacts with oxygen and other constituents that may be present to form a glass-like material. The carbon body also has an additional protective layer essentially within the original dimensions of the uncoated carbon body which has been converted at least in part to boron carbide ($B_4C$). $B_4C$ in use reacts with any oxygen that succeeds in penetrating the intermediate coating forming $B_2O_3$ which is also glass-like in nature.

DETAILED DESCRIPTION OF THE INVENTION

Figure 1:
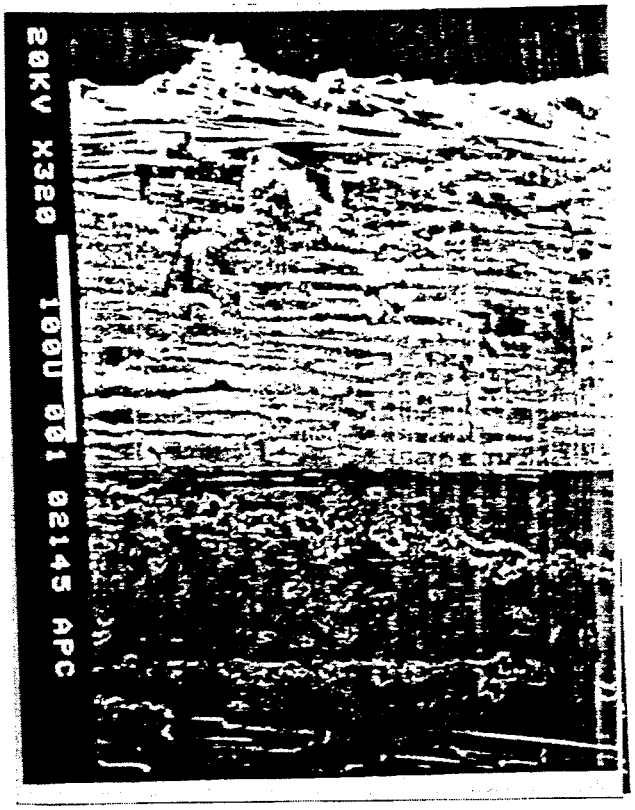
FIG. 1 illustrates a scanning electron micrograph of a cross-section of a carbon/carbon composite surface which has been etched with boron oxide.

It has been discovered that the etching of the surface of the carbon body with gaseous boron oxide provides a highly desirable surface upon which to deposit the selected intermediate coating and also provides a further measure of protection against oxidative attach on the carbon body. The oxygen present in the boron oxide reacts at the processing conditions with carbon to form gaseous carbon monoxide. This results in the formation of interconnected interstices or pores extending into and beneath the surface of the carbon body. The boron reacts with the carbon to form boron carbide in accordance with the formula $2B_2O_3 + 7C \rightarrow B_4C + 6CO$. The surface of the carbon body is not eroded uniformly with the result that interconnected pore-like interstices are formed. The boron oxide reacts with the carbon body to a depth that is determined by the length of contact time. The interstices contribute to the total void volume which occupies up to about 50 percent of the volume of the converted layer. The surface of the carbon body, including the internal surfaces of the interstices, contains boron carbide.

As stated, etching of the carbon body with gaseous boron oxide provides two beneficial results. First, the interconnected interstices act as a reservoir for the intermediate coating thereby increasing the volume of the intermediate coating material available for reaction with oxygen. Second: the gaseous boron oxide etch reacts with carbon in the carbon body to form boron carbide which is contained in the porous surface. Boron carbide reacts with oxygen to form glass-like boron oxide. Thus, any oxygen that penetrates the intermediate coating is consumed by the boron carbide before it is able to attack the carbon body.

In order to achieve the desired porous surface, the boron oxide etchant must be in the gaseous state. Liquid or solid boron oxide has been found to be too reactive and the surface of the carbon body becomes completely eroded, as compared to forming interconnecting interstices, when boron oxide other than in gaseous form is used.

The carbon body to which the oxidation-resistant coatings are applied may be any one of a number of suitable structural forms of carbon, depending upon the intended use, and may include monolithic graphite, a composite of carbon fibers dispersed in a carbon matrix which in turn may be fully or partially graphitized, or any other suitable carbon. The carbon body may, for example, be a turbine part, a pump impeller, a spacecraft wing edge, or a component of rocket nozzles and engines. The particular type of structure of the carbon body does not form a part of the present invention.

In accordance with the present invention, the untreated carbon body is placed in a suitable reaction chamber, for example, a chemical vapor deposition reactor such as is well-known in the prior art. The carbon body is heated to a temperature above about 1500° C. and more preferably between about 1600° C. and about 1750° C. Higher temperatures are satisfactory but are not required. The pressure in the reaction chamber is maintained between about 0.1 Torr and about atmospheric pressure. Argon at a temperature of between about ambient and 1750° C. is flowed through the chamber as a carrier gas at flow rate of between about 0 and 100,000 standard cubic centimeters per minute (SCCM) for reactors having up to about 36 inch inside diameter and greater than 100,000 SCCM for larger reactors. The gaseous boron oxide may be obtained by the vaporization of boron oxide or may be obtained by reaction in the gaseous state, e.g., by reaction of boron trichloride and a source of oxygen such as steam or a mixture of hydrogen and carbon dioxide. Increased concentration and increased reaction temperatures create increased depth of etch as does increased reaction time. The boron oxide flow rate is controlled between about 1 and about 7000 SCCM for small reactors and over 7000 SCCM for larger reactors. The reaction time may be controlled between about 30 seconds and about 120 minutes and the depth of the etch is generally between about 2 and about 250 microns. If desired, the reaction can be continued until the carbon body is etched throughout. The etched layer of the carbon body generally has a void volume approaching 50 percent of the volume originally occupied by the carbon body.

The etched carbon body is then provided with a glass forming intermediate coating the purpose of which is to react with any oxygen that may enter a crack or rupture and to form a glass-like sealant preventing the oxygen from reaching the carbon surface. In some instances such as when abrasion or erosion resistance are not required, the intermediate coating may be the only protective coating applied to the carbon body. However, for most environments and best oxidation resistance further outer coatings are applied over the intermediate coating.

The low temperature glass forming intermediate coating comprises a primary glass forming species which may be boron, boron oxide, boron carbide, silicon, silicon alloy, silicon dioxide, germania, and mixtures thereof which may be deposited on the etched surface of the carbon body by any convenient means such as chemical vapor deposition or other techniques such as sol-gel impregnation.

The intermediate coating may also contain borides and oxides of zirconium, aluminum, magnesium, hafnium, titanium, carbides of zirconium, hafnium, titanium, nitrides of zirconium, hafnium, titanium, silicon and mixtures thereof.

Preferably, the intermediate coating partially fills the interstices left as a result of the boron oxide etch. Thus, the void volume produced by the etching step is partially eliminated and the resulting product is essentially the same in its characteristics as the original carbon body.

Silicon may be deposited on the surface of the etched carbon body at a temperature higher than the melting point of silicon, or the silicon may be deposited at a temperature below its melting point and the coated part may subsequently be raised to above the melting point. In either case the silicon, at temperatures above its melting point, "wicks" into and fills the interstices of the etched surface, creating a fully dense surface.

The silicon may react in part with the boron carbide coating that results from the boron oxide etch according to the formula $2Si + B_4C \rightarrow SiB_4 + SiC$. Where chemical vapor deposition is used to deposit silicon, x-ray diffraction data indicates that simple $SiB_4$ is not actually formed but a similar and more complex compound results, namely $B_4(Si,B,C)H$. This probably results from the fact that during chemical vapor deposition of silicon, a hydrogen containing carrier gas is used.

When a silicon alloy intermediate coating is desired, the silicon may be alloyed with one or more other useful elements such as chromium, aluminum, titanium, zirconium, hafnium, vanadium, niobium, tantalum, tungsten, and molybdenum. These elements may be provided in the interstices along with the silicon by suitable deposition techniques as described above, or may be subsequently introduced via a displacement reaction. The free or combined silicon can be displaced in part by any of the above-names species in accordance with reactions similar to the one for titanium as follows:

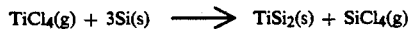

$$TiCl_4(g) + 3Si(s) \longrightarrow TiSi_2(s) + SiCl_4(g)$$

or

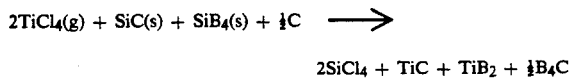

$$2TiCl_4(g) + SiC(s) + SiB_4(s) + \tfrac{1}{4}C \longrightarrow 2SiCl_4 + TiC + TiB_2 + \tfrac{1}{4}B_4C$$

The use of a boron intermediate coating is particularly desirable when oxidation resistance in the temperature range of 500° C. to 700° C. is desired. Boron oxide is reported to have a melting point in the range of about 450° to 580° C. under ambient conditions. Thus the boron oxide that is formed by reaction of any oxygen that migrates through cracks or ruptures in the outer coating melts and flows into cracks, ruptures, etc. at much lower temperatures than does silicon. This makes boron a desirable intermediate coating where the environment of the carbon part is below the melting point of silicon.

When a carbon body is subjected to thermal cycling such that it is exposed to high temperatures above the melting point of silicon as well as low temperatures in the neighborhood of the melting point of boron oxide, it may be desirable to utilize both a silicon coating and a boron coating.

The boron coating is applied by chemical vapor deposition with the carbon body heated to a temperature above about 500° C., preferably between about 800° C. and about 1600° C. The pressure is maintained between about 0.1 Torr and about 760 Torr, preferably between about 1 Torr and about 200 Torr. A gaseous mixture of a decomposable boron gas, e.g., boron trihalide, preferably boron trichloride, hydrochloric acid, hydrogen, and argon of the following composition may be flowed over the etched carbon body:

| Gas | Flow Rate, SCCM | % of Total Gas |
|---|---|---|
| BCl$_3$ | 440–1500 | 2.4–14.5 |
| H$_2$ | 200–6000 | 6.6–15.8 |
| HCl | 0–7400 | 0–19.5 |
| Ar | 2000–32000 | 60.7–76.2 |

The gas temperature is maintained between about ambient and 1600° C. and the contact time may be varied between about 30 seconds and about 4 hours. A total gas flow rate of between about 100 and about 100,000 SCCM, preferably between about 2600 and about 47,000 SCCM for a reactor having an internal diameter of less than one foot may be used. This results in a boron intermediate coating having a thickness of between about 0.1 micron and 500 microns.

The outer refractory coating may comprise carbides, borides or nitrides of silicon, zirconium, tantalum, hafnium, niobium, titanium, aluminum boride or nitride or mixtures thereof. Additionally the refractory coating may comprise silicon oxynitride.

It is generally desirable to provide an outer coating of silicon carbide on top of the intermediate coating. The provisions of such overcoating is described in the prior art including the aforementioned U.S. Pat. No. 4,515,860 and may be produced by chemical vapor deposition.

The following examples, which are given to more specifically illustrate some of the ways the method of the invention may be practiced, are not intended to limit the scope of the appended claims.

EXAMPLE 1

The carbon carbon composite material substrate comprising T-300 material available from Avco Systems was heated to a temperature of 1650° C. with flow rates of argon and B$_2$O$_3$ of 2030 SCCM and 30 SCCM, respectively. The etching time was 60 minutes which resulted in a depth of about 125 microns (5 mils) at 50% void volume. Subsequently, flows of SiCl$_4$ at 925 SCCM, nitrogen at 10,000 SCCM and hydrogen at 20,000 SCCM were established. The part temperature was reduced to 1280° C. and the flow was continued for 20 minutes. A silicon deposit of 112.5 microns (4.2 mils) in depth resulted on the surface of the substrate. The substrate was subsequently heated to just above the melting temperature of silicon, e.g., 1410° C. to permit the silicon to wick into the void spaces, thus partially filling them. Upon heating to 1375° C. in air, the substrate exhibited excellent oxidation resistance.

EXAMPLE 2

A carbon carbon composite material substrate comprising T-300 material available from Avco Systems was supported in a chemical vapor deposition reactor and heated to a temperature of between about 1700° C. and 1750° C. A flow of argon at 2,030 SCCM and a flow of B$_2$O$_3$ gas at a rate of 10 SCCM were established. The flow was continued for a period of 60 minutes and resulted in an etching to about 50% void volume to a depth of about 75 microns (3 mils). Following this, a deposit of silicon was formed on the substrate at a substrate temperature of 1175° C. and a pressure of 250 Torr using a flow of SiCl$_4$ of 924 SCCM, nitrogen at 10,000 SCCM and hydrogen at 20,000 SCCM. The resulting CVD deposit was heated above the melting point of silicon and partially filled the void volume in the etched substrate. A boron coating was then deposited over the silicon coating and an outer silicon carbide coating was deposited on the boron layer under conditions as described herein. The deposit exhibited very high oxidation resistance in temperature cycling tests to a maximum of 1375° C. in air, exhibiting less than one percent weight loss in 24 hours.

EXAMPLE 3

Boron oxide gas may be produced by placing solid boron oxide in a crucible, preferably above the part, and by heating the solid material therein to melt the boron oxide and to subsequently vaporize it. The vapor then flows down over the part along with an argon carrier gas to produce the surface etching.

EXAMPLE 4

As an alternative to vaporizing boron oxide, hydrogen or argon gas may be saturated with water vapor by bubbling the heated gas through water. At a pressure of 40 Torr and at room temperature, the result is a carrier gas in which there are equal molar volumes of water and hydrogen or argon. A flow of boron chloride or other halide of boron may then be introduced to the chamber in a ratio to the carrier gas of about 1:3. At a substrate temperature of 1600° C., the substrate surface will be etched and converted to $B_4C$ in about several hours to a depth of a hundred microns (a few mil) with about 50% void volume. A greater etching depth may be achieved at higher substrate temperatures.

EXAMPLE 5

As an alternative to the previous example, boron chloride ($BCl_3$) may be mixed with carbon dioxide and hydrogen in equal parts with a ratio of the carbon dioxide-hydrogen mix to boron chloride of about 3 to 1. At a 1600° C. substrate temperature, the surface of the substrate is etched to about 50% void volume and converted to boron carbide ($B_4C$). The etch rate is significantly slower than that of the previous example because of the presence of high amounts of carbon monoxide resulting from the reaction.

EXAMPLE 6

In depositing the silicon intermediate coating on the part after the etching step, one or more volatile halides of chromium, aluminum, titanium, zirconium, hafnium, or vanadium may be added to the silicon halide-hydrogen mix in the gas stream. Since the metals tend to deposit less readily than the silicon, the resulting silicon alloy deposit will contain minor proportions of the metals in relation to the silicon. The conditions under which such deposits may be achieved are similar to those in the previous examples and may follow conventional vapor deposition procedures.

EXAMPLE 7

As an alternative to the previous example, the silicon coating may be alloyed by depositing the silicon and subsequently producing a flow of hydrogen and a metal halide or argon and a metal halide from the group of Example 6. Argon and a metal halide or niobium, tantalum, tungsten or molybdenum may also be used at or below the melting temperature of silicon. A diffusion coating of the metal will result in the silicon deposit.

EXAMPLE 8

This example was conducted to illustrate the improved oxidation resistance of carbon bodies that have been provided with an etched surface by means of a boron oxide-carbon reaction. Carbon-carbon composite coupons measuring $\frac{1}{2}"\times1"\times\frac{1}{8}"$ were prepared. Six coupons, Sample A, were treated in accordance with the prior art in a saturated solution of chromic and sulfuric acid at 121° C. for five minutes, with agitation, and air-dried at 41° C. for one hour. These coupons did not have a porous surface with interconnecting interstices and did not have boron carbide in or on the surface thereof.

Twelve additional coupons were subjected to gaseous boron oxide etching in accordance with the present invention. The coupons were held stationary in a chemical vapor deposition reaction and heated to 1700° C. at a pressure of 45 Torr. Argon at a flow rate of 2030 SCCM was used to entrain vaporized boron oxide from a boron oxide charge induction heated in the same field as the coupon. The reaction time was sixty minutes.

Six coupons, Sample B, were subjected to a three gram charge of boron oxide etchant and six coupons, Sample C, were subjected to a ten gram charge of boron oxide etchant. The resulting coupons had an etched porous surface made up of interconnecting interstices containing boron carbide in and on surface thereof.

The coupons of Samples A, B and C were then provided with a boron glass forming intermediate coating in a chemical vapor deposition reactor at a temperature of 1400° C. and a pressure of 150 Torr. A gaseous mixture of 700 SCCM boron trichloride, 700 SCCM hydrogen chloride, 6000 SCCM argon and 1000 SCCM hydrogen was flowed into the reactor for thirty minutes per side.

The coupons were then provided with a silicon carbide outer coating in a chemical vapor deposition reactor at 1400° C. and a pressure of 150 Torr. The first sides of the coupons were coated for 26 minutes and the second side was coated for 24 minutes. In each instance the gaseous reactants had the following composition:

| Reagent | Flow rate, SCCM |
| --- | --- |
| Methyl trichlorosilane | 1,250 |
| $N_2$ | 6,500 |
| $H_2$ | 3,000 |

A further batch of coupons, Sample D, was prepared in order to provide a silicon intermediate coating. The boron oxide etch step in the process was carried out in the manner stated above except that a thirty (30) gram charge of boron oxide was employed. A silicon intermediate coating was applied to both sides of the coupon at a temperature of 1175° C. and at a pressure of 250 Torr. The flow rate of the gaseous reaction mixture was 20,000 SCCM hydrogen, 10,000 SCCM nitrogen, and 924 SCCM silicon tetrachloride. The reaction continued for 45 minutes. The temperature was then raised at 1525° C. for ten (10) minutes with an argon flow rate of 14,500 SCCM and less than 100 Torr. to melt the deposited silicon.

A silicon carbide outer coating was applied over the silicon intermediate coating at a temperature of 1400° C. and a pressure of 150 Torr. The flow rate of the gaseous reaction mixture was 3,750 SCCM hydrogen, 6,500 SCCM nitrogen, and 1,250 SCCM methyl trichlorosilane. The reaction time was 18 minutes. The intermediate glass forming coating of silicon substantially filled interconnecting interstices of porous Sample D in comparison to the preferred operation of partially filling of the interstices of Example E as described below.

Scanning electron microscope examination of those coupons subjected to gaseous boron oxide etching showed that the coupons reacted with a three (3) gram charge of boron oxide has an etched layer less than ten (10) microns in thickness, those etched with a 10 gram charge of boron oxide had an etched layer less than forty (40) microns in thickness, and those etched with a thirty (30) gram charge of boron had a etched layer of approximately 150 microns in thickness.

Another batch of coupons, Sample E, was prepared having both a silicon and a boron intermediate coating partially filling the interstices of the gaseous boron oxide converted carbon body. The boron oxide etch was obtained under the conditions set forth above using a 30 gram charge of boron oxide thereby providing an etched layer about 150 microns thick, The boron, silicon, and silicon carbide coatings were applied under the conditions set forth earlier in this Example.

The oxidation resistance of coupon samples A-E was tested by heating them in air in a furnace and cycling the temperature from a baseline of 650° C. to a temperature between 1200° C. and 1375° C. The coupons were weighed hourly and a five percent weight loss was selected as the failure point. The results are set forth in Table I.

TABLE I

|  | Coupon Samples | | | | |
| --- | --- | --- | --- | --- | --- |
|  | A | B | C | D | E |
| Mean survival time, hrs. | 22 | 28 | 49.8 | 15 | 30 |
| Standard deviation. hrs. | 1.4 | 1.4 | 12 | 5 | 19.7 |
| Coefficient of variation | 0.06 | 0.05 | 0.24 | 0.33 | 0.66 |

Various of the features of the invention are set forth in the following claims.

EXAMPLE 9

This example illustrates the excellent oxidation performance of a carbon-carbon body etched using gaseous boron-oxide, which results in a porous surface zone of interconnected porosity which also contains boron carbide. A two-dimensional, T-300 fiber, carbon-carbon composite was coated in accordance with the present invention. Thirty grams of boron oxide were vaporized and passed over the carbon-carbon material at a temperature of 1700° C. and a pressure of 45 torr for 60 minutes; argon was used as a carrier gas. FIG. 1 illustrates the microstructure of the boron oxide converted carbon-carbon surface layer. The cross-sectional micrograph illustrates the highly porous zone of ∼50% porosity; in addition, the interconnection of the internal pores is also apparent. X-ray diffraction analysis of the surface indicates the presence of boron carbide ($B_4C$). Subsequently, the composite was given a silicon intermediate coating using the following process conditions: temperature=1125° C., pressure=250 torr, time=45 minutes. Gaseous reactant flow rates were 924 SCCM silicon tetrachloride, 20,000 SCCM hydrogen and 12,500 SCCM nitrogen. Subsequently, the temperature was raised to 1525° C. for 10 minutes at a pressure of 117 torr in a carrier flow of argon at 14,500 SCCM. Boron was subsequently deposited using the conditions as described in Example 8 above. A silicon carbide overcoat was provided to the parts at a temperature of 1400° C. and a pressure of 150 torr. The gaseous flow rates were 3000 SCCM hydrogen, 11,500 SCCM nitrogen, and 1250 SCCM methyltrichlorosilane. The reaction was conducted for 12 minutes. Analysis of the resulting coating microstructure indicated that the intermediate coating had partially filled the interstices of the boron oxide converted layer. Using the same oxidation performance test procedure as described in Example 8, the mean survival time of the resulting coated carbon body of this invention was 72 hours.

EXAMPLE 10

A carbon-carbon insert to a rocket nozzle assembly, which had been subjected to a boron oxide etch at 1700° C. and 16-23 torr for 46 minutes was heated in a graphite furnace to 1350° C. at 45 torr. An atmosphere of $H_2$ was maintained by passing 7500 cc/min. of $H_2$ over the rocket nozzle insert. Next, the part was subjected to a silicon carbon coating step in which the equilibrium vapor pressure at room temperature of methyltrichlorosilane (MTS) was introduced for five minutes to produce about 1 mil silicon carbide (SiC) coating which was adherent by visual inspection. After this period, 700 cc/min.-chlorine was passed through a bed of approximately eight inches of Hf chips located in a quartz pot above the substrate and separately heated to 480°-540° C. The $H_2$ flow and MTS were continued. Concurrent with the initiation of the chlorine flow, 400 cc/min of methyl chloride were passed in contact with the $HfCl_4$ and $HfCl_3$ vapors leaving the Hf reactor, and thence passed over the substrate to codeposit SiC and hafnium carbide. These flows were continued for a period of two hours, and resulted in a total coating thickness of 280 microns (11.1 mils).

Results: The coated nozzle insert was taken out of the furnace, which had been cooled down, and placed on a rack. An oxygen acetylene torch producing a flame at a maximum temperature of 1430°1480° C., was applied directly to the part, with the coating remaining in place.

EXAMPLE 11

A carbon-carbon insert to a rocket nozzle assembly,- which had been subjected to a boron oxide etch at 1700° C. and 16-12 torr for 46 minutes was heated in a graphite furnace to 1350° C. at 45 torr. An atmosphere of $H_2$ was maintained by passing 7500 cc/min. of H over the rocket nozzle insert. Next, the part was subjected to a silicon carbon coating step in which the equilibrium vapor pressure at room temperature of methyltrichlorosilane (MTS) was introduced for five minutes to produce about 1 mil silicon carbide (SiC) coating which was adherent by visual inspection. After this period, the MTS was discontinued, while the $H_2$ flow was maintained. A flow of 700 cc/min of chlorine was passed through a bed of approximately eight inches of Hf chips located in a quartz pot above the substrate, and separately heated to 500°-550° C. Concurrent with the initiation of the chlorine flow, 400 cc/min of methyl chloride were passed in contact with the $HfCl_4$ and $HfCl_3$ vapors leaving the Hf reactor, and thence passed out the substrate to deposit a coating of hafnium carbide. These flows were contained for a period of two hours.

Results: The coated nozzle insert was taken out of the furnace, which had been cooled down, and placed on a rack. An oxygen acetylene torch producing a flame at a maximum temperature of 1430°-1480° C. (2600°-2700° F.), was applied directly to the part, with the coating remaining in place.

EXAMPLE 12

A carbon-carbon coupon, which had been subjected to a boron oxide etch according to Example 1 of this invention, was heated in a graphite furnace to 1345° C. at 45 torr and an atmosphere of $H_2$ was maintained by passing 7500 cc/min of $H_2$ over the coupon. Next, MTS was introduced into the furnace at a flowrate of 750 cc/min. The $H_2$ and MTS flowed over the coupon to produce a silicon carbide (SiC) coating. These conditions were maintained for 90 minutes and resulted in about 16 mils of SiC coating acting as both an intermediate coating and an outer refractory coating.

Results: Upon cooling, the coated coupon was removed from the furnace and placed on a rack. An acetylene torch producing a flame at a maximum temperature of 1430°–1480° C. (2600°–2700° F.) was applied directly to the coated coupon, with the coating remaining in place.

What is claimed is:

1. A method for the manufacture of a coated carbon body having improved resistance to high temperature oxidation comprising:

providing a carbon body, contacting said carbon body with gaseous boron oxide at an elevated temperature sufficient to cause reaction between the carbon body and the boron oxide thereby forming a converted porous layer containing interconnecting interstices in said body, which layer contains boron carbide, applying an intermediate glass forming coating over said converted layer, and applying an outer refractory coating over said intermediate coating.

2. A method in accordance with claim 1 wherein the elevated temperature is at least about 1500° C. to cause said converted layer to reach a depth of between about 2 and 250 microns.

3. A method in accordance with claim 1 wherein said converted layer has a void volume of up to about 50 percent of the volume originally occupied by the carbon layer.

4. A method in accordance with claim 1 wherein the intermediate coating comprises a primary glass forming species selected from boron, boron carbide, boron oxide, silicon, silicon alloys, silicon dioxide, germania, and mixtures thereof.

5. A method in accordance with claim 4 wherein said intermediate coating also contains borides and oxides of zirconium, aluminum, magnesium, hafnium, titanium, carbides of zirconium, hafnium, titanium, nitrides of zirconium, hafnium, titanium, silicon and mixtures thereof.

6. A method in accordance with claim 1 wherein the intermediate coating is applied by chemical vapor deposition.

7. A method in accordance with claim 1 wherein the outer refractory coating is applied by chemical vapor deposition.

8. A method in accordance with claim 1 wherein the outer refractory coating comprises carbides, borides or nitrides of silicon, zirconium, tantalum, hafnium, niobium, titanium, aluminum boride or nitride or mixtures thereof.

9. A method in accordance with claim 1 wherein the outer refractory coating is silicon carbide.

10. A method in accordance with claim 1 wherein the refractory coating comprises a mixture of silicon carbide and hafnium carbide.

11. A method in accordance with claim 1 wherein the refractory coating is silicon nitride.

12. A method in accordance with claim 1 wherein the refractory coating is silicon oxynitride.

13. A method in accordance with claim 1 wherein the refractory coating is hafnium carbide.

* * * * *